(12) United States Patent
Kato et al.

(10) Patent No.: US 11,424,397 B2
(45) Date of Patent: Aug. 23, 2022

(54) ELECTRODE MATERIAL FOR THERMOELECTRIC CONVERSION MODULES AND THERMOELECTRIC CONVERSION MODULE USING SAME

(71) Applicant: LINTEC CORPORATION, Itabashi-ku (JP)

(72) Inventors: Kunihisa Kato, Warabi (JP); Wataru Morita, Saitama (JP); Tsuyoshi Muto, Saitama (JP); Yuma Katsuta, Gyoda (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 16/493,345

(22) PCT Filed: Mar. 13, 2018

(86) PCT No.: PCT/JP2018/009680
§ 371 (c)(1),
(2) Date: Sep. 12, 2019

(87) PCT Pub. No.: WO2018/168837
PCT Pub. Date: Sep. 20, 2018

(65) Prior Publication Data
US 2020/0144471 A1  May 7, 2020

(30) Foreign Application Priority Data
Mar. 16, 2017 (JP) .............................. JP2017-051635

(51) Int. Cl.
*H01L 35/08* (2006.01)
*H01L 35/16* (2006.01)
*H01L 35/18* (2006.01)

(52) U.S. Cl.
CPC .............. *H01L 35/08* (2013.01); *H01L 35/16* (2013.01); *H01L 35/18* (2013.01)

(58) Field of Classification Search
CPC ......... H01L 35/16; H01L 35/18; H01L 35/08; H01L 35/32
See application file for complete search history.

(56) References Cited

U.S. PATENT DOCUMENTS 6,410,840 B1 * 6/2002 Sudo ....................... H01L 35/16
136/201
6,410,971 B1 * 6/2002 Otey ....................... H01L 35/32
257/467

(Continued)

FOREIGN PATENT DOCUMENTS

JP      2006-186255 A      7/2006
JP   WO2016/039022 A1    3/2016

(Continued)

OTHER PUBLICATIONS

International Search Report dated May 22, 2018 in PCT/JP2018/009680 filed on Mar. 13, 2018.

*Primary Examiner* — Jayne L Mershon
(74) *Attorney, Agent, or Firm* — Oblon, McClelland, Maier & Neustadt, L.L.P.

(57) ABSTRACT

Provided are an electrode material for thermoelectric conversion modules capable of preventing cracking and peeling of electrodes that may occur at the bonding parts of a thermoelectric element and an electrode under high-temperature conditions to thereby maintain a low resistance at the bonding parts, and a thermoelectric conversion module using the material. The electrode material for thermoelectric conversion modules includes a first substrate and a second substrate facing each other, a thermoelectric element formed between the first substrate and the second substrate, and an electrode formed on at least one substrate of the first (Continued)

substrate and the second substrate, wherein the substrate is a plastic film, the thermoelectric element contains a bismuth-tellurium-based thermoelectric semiconductor material, a telluride-based thermoelectric semiconductor material, an antimony-tellurium-based thermoelectric semiconductor material, or a bismuth-selenide-based thermoelectric semiconductor material, the electrode that is in contact with the thermoelectric element is formed of a metal material, and the metal material is gold, nickel, aluminum, rhodium, platinum, chromium, palladium, stainless steel, molybdenum or an alloy containing any of these metals.

5 Claims, 2 Drawing Sheets

(56) References Cited

U.S. PATENT DOCUMENTS

| | | |
|---|---|---|
| 2006/0201161 A1 | 9/2006 | Hirai et al. |
| 2012/0042921 A1* | 2/2012 | Kim ............... H01L 35/08 136/200 |
| 2013/0037071 A1* | 2/2013 | Gerster ........... H01L 35/32 136/203 |
| 2014/0261604 A1* | 9/2014 | Jha ................ H01L 35/26 136/200 |
| 2015/0179912 A1 | 6/2015 | Maeshima et al. |
| 2015/0228879 A1* | 8/2015 | Kato ............... H01L 35/16 136/236.1 |
| 2015/0311420 A1* | 10/2015 | Akabane ......... H01L 35/32 136/203 |
| 2019/0027670 A1* | 1/2019 | Yoo ................ H01L 35/32 |
| 2019/0051807 A1* | 2/2019 | Okumura ....... H01L 35/34 |
| 2019/0181322 A1* | 6/2019 | Lee ................ H01L 35/32 |

FOREIGN PATENT DOCUMENTS

| | | |
|---|---|---|
| WO | 2004-21 4279 A | 7/2004 |
| WO | WO 201 4/199541 A1 | 12/2014 |
| WO | WO 201 6/147809 A1 | 9/2016 |

* cited by examiner

ELECTRODE MATERIAL FOR THERMOELECTRIC CONVERSION MODULES AND THERMOELECTRIC CONVERSION MODULE USING SAME

TECHNICAL FIELD

The present invention relates to an electrode material for thermoelectric conversion modules using a thermoelectric element that carries out energy interconversion between heat and electricity and to a thermoelectric conversion module (thermoelectric generation module, Peltier cooling module) using the material.

BACKGROUND ART

Heretofore, there is known a device that enables direct interconversion between heat energy and electric energy by a thermoelectric conversion module having a thermoelectric effect such as a Seebeck effect and a Peltier effect, as one means of effective energy utilization.

As the thermoelectric conversion module, use of a so-called π-type thermoelectric conversion device is known. Regarding the π-type device, a pair of electrodes spaced from each other are arranged on a substrate and, for example, a p-type thermoelectric element is arranged on one electrode while an n-type thermoelectric element is on the other electrode, as similarly spaced from each other, and the upper faces of the two thermoelectric materials are connected to the electrodes of a facing substrate to constitute such a π-type device. In addition, use of a so-called in-plane-type thermoelectric conversion device is known. Regarding the in-plane-type device, plural thermoelectric elements are aligned in such a manner that n-type thermoelectric elements and p-type thermoelectric elements are alternately arranged, and for example, the lower electrodes of the thermoelectric elements are connected in series to constitute such an in-plane-type device.

Given the situation, there are demands for improving the flexibility of thermoelectric conversion modules, thinning the modules and improving the thermoelectric performance thereof. For satisfying these demands, for example, a resin substrate of polyimide or the like is used as a substrate for thermoelectric conversion modules from the viewpoint of heat resistance and flexibility thereof. As an n-type thermoelectric semiconductor material and a p-type thermoelectric semiconductor material, a thin film of a bismuth telluride material is used from the viewpoint of thermoelectric performance thereof, and as electrodes, a Cu electrodes having a high thermal conductivity and a low resistance is used (Patent Literatures 1 and 2).

PATENT LITERATURE

Patent Literature 1: JP 2006-186255 A
Patent Literature 2: WO 2016/039022

SUMMARY OF INVENTION

Technical Problem

However, as described above, among the demands for improving the flexibility of thermoelectric conversion modules, thinning the modules and improving the thermoelectric performance thereof, in the case where a bismuth telluride-based material is used as a thermoelectric semiconductor material, a Cu electrode is used as an electrode and a resin such as polyimide or the like is used as a substrate, for example, in a step of annealing the thermoelectric conversion module at a high temperature of 300° C. or so, an alloy phase is formed at the bonding parts of the thermoelectric semiconductor material and the Cu electrode and, as a result, the electrode cracks or peels to thereby increase the electric resistance value between the thermoelectric semiconductor material and the Cu electrode to cause a new problem of thermoelectric performance degradation, which the present inventors have found as a result of investigations.

An object of the present invention is to provide an electrode material for thermoelectric conversion modules capable of preventing cracking and peeling of electrodes that may occur at the bonding parts of a thermoelectric element and an electrode under high-temperature conditions to thereby maintain a low resistance at the bonding parts, and to provide a thermoelectric conversion module using the material.

Solution to Problem

The present inventors have assiduously made repeated studies for solving the above-mentioned problems and, as a result, have found that, when a metal material capable of preventing formation of an alloy phase at the bonding parts between an electrode and a thermoelectric element that contains a bismuth-tellurium-based thermoelectric semiconductor material, at a high temperature in an annealing treatment, is used as an electrode material on a substrate, then cracking and peeling at the bonding parts between the thermoelectric element and the electrode that may occur at the annealing treatment can be prevented to thereby maintain low resistance and, as a result, a thermoelectric conversion module having high thermoelectric performance can be obtained, and have completed the present invention.

Specifically, the present invention provides the following (1) to (7):

(1) An electrode material for thermoelectric conversion modules including a first substrate and a second substrate facing each other, a thermoelectric element formed between the first substrate and the second substrate, and an electrode formed on at least one substrate of the first substrate and the second substrate, wherein the substrate is a plastic film, the thermoelectric element contains a bismuth-tellurium-based thermoelectric semiconductor material, a telluride-based thermoelectric semiconductor material, an antimony-tellurium-based thermoelectric semiconductor material, or a bismuth-selenide-based thermoelectric semiconductor material, the electrode that is in contact with the thermoelectric element is formed of a metal material, and the metal material is gold, nickel, aluminum, rhodium, platinum, chromium, palladium, stainless steel, molybdenum or an alloy containing any of these metals.

(2) The electrode material for thermoelectric conversion modules according to the above (1), wherein the thickness of a layer of the metal material is from 10 nm to 200 μm.

(3) The electrode material for thermoelectric conversion modules according to the above (1) or (2), wherein the layer of the metal material is a gold layer, a nickel layer, an aluminum layer, a rhodium layer, a stainless steel layer, a platinum layer, a chromium layer, a palladium layer, a molybdenum layer or a laminate including two or more of these layers.

(4) The electrode material for thermoelectric conversion modules according to the above (1), wherein the bismuthtellurium-based thermoelectric semiconductor material is a p-type bismuth telluride, an n-type bismuth telluride, or $Bi_2Te_3$.

(5) The electrode material for thermoelectric conversion modules according to the above (1), wherein the plastic film is at least one selected from a polyimide film, a polyamide film, a polyether imide film, a polyaramid film and a polyamideimide film.

(6) A thermoelectric conversion module including an electrode formed of the electrode material for thermoelectric conversion modules according to any of the above (1) to (5), and a thermoelectric element formed to be in contact with the electrode.

(7) The thermoelectric conversion module according to the above (6), wherein the thermoelectric element is formed of a thin film of a thermoelectric semiconductor composition containing thermoelectric semiconductor fine particles, a heat-resistant resin and an ionic liquid.

Advantageous Effects of Invention

According to the present invention, there are provided an electrode material for thermoelectric conversion modules capable of preventing cracking and peeling of electrodes that may occur at the bonding parts of a thermoelectric element and an electrode under high-temperature conditions to thereby maintain a low resistance at the bonding parts, and a thermoelectric conversion module using the material.

DESCRIPTION OF EMBODIMENTS

[Electrode Material for Thermoelectric Conversion Modules]

The electrode material for thermoelectric conversion modules of the present invention is an electrode material for thermoelectric conversion modules including a first substrate and a second substrate facing each other, a thermoelectric element formed between the first substrate and the second substrate, and an electrode formed on at least one substrate of the first substrate and the second substrate, wherein the substrate is a plastic film, the thermoelectric element contains a bismuth-tellurium-based thermoelectric semiconductor material, a telluride-based thermoelectric semiconductor material, an antimony-tellurium-based thermoelectric semiconductor material, or a bismuth-selenide-based thermoelectric semiconductor material, the electrode that is in contact with the thermoelectric element is formed of a metal material, and the metal material is gold, nickel, aluminum, rhodium, platinum, chromium, palladium, stainless steel, molybdenum or an alloy containing any of these metals.

The thermoelectric conversion module including an electrode formed of the electrode material of the present invention is, for example, such that the electrode on the first and/or second substrates is formed of gold, nickel, aluminum or the like that is prevented from forming an alloy phase with the thermoelectric element therein, and therefore, even at a high annealing temperature in producing the thermoelectric conversion module, the electrode can be prevented from cracking or peeling at the bonding parts between the electrode and the thermoelectric element and, as a result, the low resistance value that the electrode material has at the bonding parts can be kept as such to improve the thermoelectric performance of the module.

Figure 1:
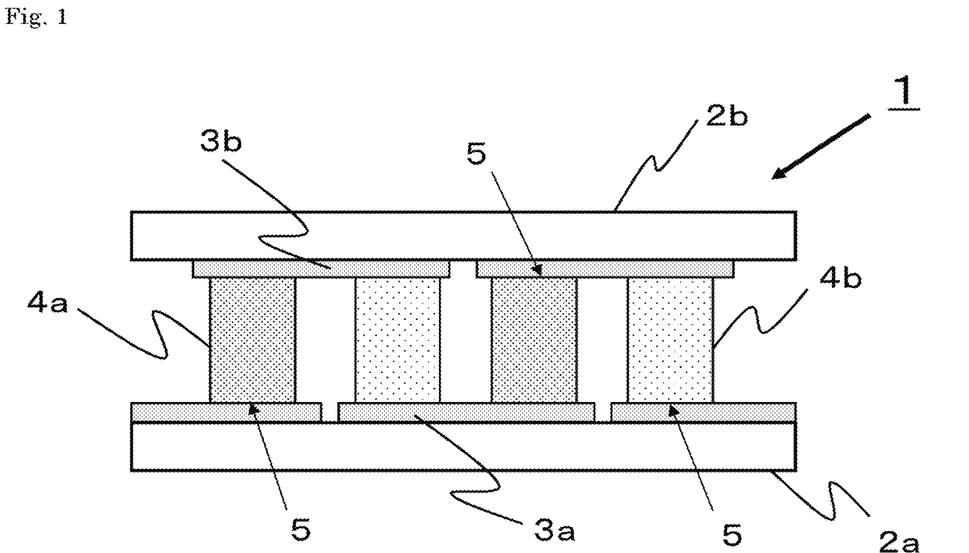
FIG. 1 is a cross-sectional view for explaining an example of a configuration of a thermoelectric conversion module including an electrode formed of an electrode material of the present invention.

FIG. 1 is a cross-sectional view for explaining an example of a configuration of a thermoelectric conversion module including an electrode formed of an electrode material of the present invention. The thermoelectric conversion module 1 is composed of a so-called π-type thermoelectric conversion element, and includes a first substrate 2a and a second substrate 2b facing each other, a p-type thermoelectric element 4a and an n-type thermoelectric element 4b formed between the first substrate 2a and the second substrate 2b, and an electrode 3a formed on the first substrate 2a and an electrode 3b formed on the second substrate 2b. In the present invention, at the bonding part 5 between the thermoelectric element and the electrode, cracking and peeling of the electrode can be prevented even through the annealing treatment at a high temperature in producing the thermoelectric conversion module.

Figure 2:
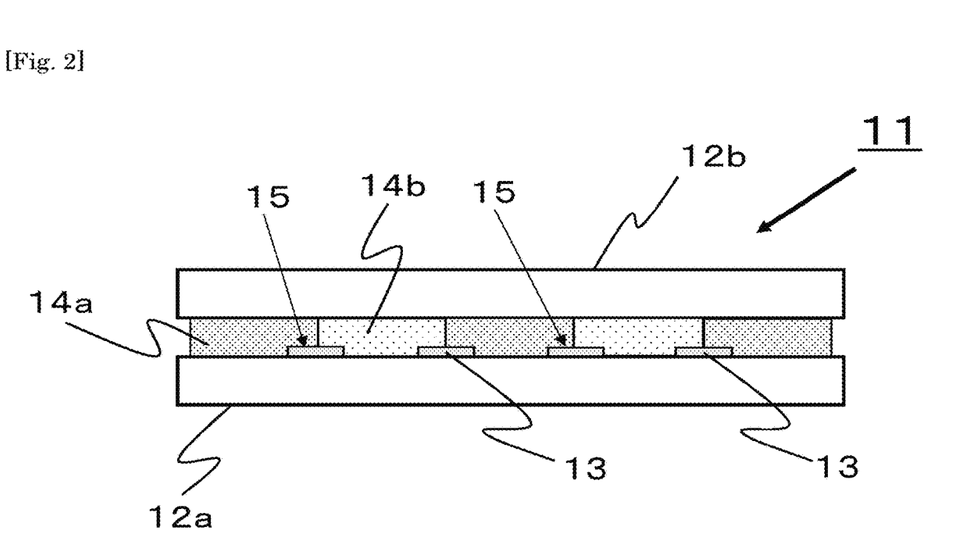
FIG. 2 is a cross-sectional view for explaining another example of a configuration of a thermoelectric conversion module including an electrode formed of an electrode material of the present invention.

Similarly, FIG. 2 is a cross-sectional view for explaining another example of a configuration of a thermoelectric conversion module including an electrode formed of an electrode material of the present invention. The thermoelectric conversion module 11 is composed of a so-called in-plane-type thermoelectric conversion element, and includes a first substrate 12a and a second substrate 12b facing each other, a p-type thermoelectric element 14a and an n-type thermoelectric element 14b formed between the first substrate 12a and the second substrate 12b, and an electrode formed on the first substrate 12a. In the present invention, at the bonding part 15 between the thermoelectric element and the electrode, cracking and peeling of the electrode 13 can be prevented even through the annealing treatment at a high temperature in producing the thermoelectric conversion module.

An annealing temperature can be appropriately controlled depending on the substrate and the thermoelectric semiconductor material to be used, but is, from the viewpoint of stabilizing thermoelectric performance and more improving thermoelectric performance through crystal growth of thermoelectric semiconductor fine particles of a particulated thermoelectric semiconductor material in a thin film, generally 200 to 350° C.

(Substrate)

As the substrate of the thermoelectric conversion module for use in the present invention, namely, as the first substrate and the second substrate, a plastic film is used not having any influence on reduction in the electrical conductivity of the thermoelectric element and on increase in the thermal conductivity thereof. Above all, from the viewpoint that it is excellent in flexibility and that, even when thin film of a thermoelectric semiconductor composition is annealed, the substrate is not thermally deformed to maintain the performance of the thermoelectric element thereon and therefore has high heat resistance and high dimensional stability, a polyimide film, a polyamide film, a polyether imide film, a polyaramid film or a polyamideimide film is preferred; and from the viewpoint of high versatility thereof, a polyimide film is especially preferred.

The thickness of the substrate is, from the viewpoint of flexibility, heat resistance and dimensional stability, preferably 1 to 1,000 µm, more preferably 10 to 500 µm, and even more preferably 20 to 100 µm.

Also preferably, the 5% weight-loss temperature of the plastic film, as measured in thermogravimetry, is 300° C. or higher, more preferably 400° C. or higher. Also preferably, the rate of dimensional change in heating thereof, as measured at 200° C. according to JIS K7133 (1999), is 0.5% or less, more preferably 0.3% or less. Also preferably, the linear expansion coefficient in the in-plane direction thereof, as measured according to JIS K7197 (2012), is 0.1 ppm·° C.$^{-1}$ to 50 ppm·° C.$^{-1}$, more preferably 0.1 ppm·° C.$^{-1}$ to 30 ppm·° C.$^{-1}$.

(Electrode)

The metal material for the electrode on the first and/or second substrates of the thermoelectric conversion module for use in the present invention is gold, nickel, aluminum, rhodium, platinum, chromium, palladium, stainless steel, molybdenum or an alloy containing any of these metals.

Among these, from the viewpoint of preventing formation of an alloy phase at the bonding parts to the thermoelectric element containing a thermoelectric semiconductor material to be mentioned below, preferred is a gold layer, a nickel layer, an aluminum layer, a rhodium layer, a platinum layer, a chromium layer, a palladium layer, a stainless steel layer, a molybdenum layer, or a laminate containing two or more of these layers; more preferred is a gold layer, a nickel layer, an aluminum layer, a laminate of gold and nickel, a laminate of rhodium and nickel, a platinum layer, a laminate of chromium and nickel, a laminate of gold, palladium and nickel, a stainless steel layer, or a laminate of gold and stainless; and especially preferred is a gold layer, or a laminate of gold and nickel.

Stainless steel is an alloy containing Fe and Cr, and may further contain Ni, C, Si, Mn, Mo, Cu, Nb, etc. The stainless steel for use in the present invention includes austenite-type stainless such as SUS201, SUS202, SUS301, SUS302, SUS303, SUS304, SUS305, SUS316, or SUS317; martensite-type stainless such as SUS403, SUS420, or SUS630; ferrite-type stainless such as SUS405, SUS430, or SUS430LX.

Examples of the nickel-containing alloy include an alloy that contains one or more selected from phosphorus, titanium, vanadium, chromium, iron, cobalt, copper, tungsten or the like, and nickel, and those produced industrially include INCONEL (registered trademark), and HASTELLOY (registered trademark).

The thickness of a layer of the metal material is preferably 10 nm to 200 µm, more preferably 30 nm to 150 µm, even more preferably 50 nm to 120 µm. When the thickness of the layer of the metal material falls within the above-mentioned range, the electrical conductivity thereof can be high to give a low-resistance layer having a strength enough for electrodes.

For electrode formation, the above-mentioned metal material is used.

The method for electrode formation includes a method of forming an unpatterned electrode layer on a substrate, and then patterning the layer in a desired manner through known physical treatment of mainly photolithography or chemical treatment or a combination thereof, or a method of directly forming a pattern of an electrode layer through screen printing or inkjet printing.

The method for forming an unpatterned electrode layer includes a dry process of PVD (physical vapor deposition) such as vacuum evaporation, sputtering or ion plating, or CVD (chemical vapor deposition) such as thermal CVD or atomic layer deposition (ALD), a wet process of various coating methods such as a dip coating method, a spin coating method, a spray coating method, a gravure coating method, a die coating method or a doctor blade coating method, and an electrodeposition method, and a silver salt method, an electroplating method, an electroless plating method, and a metal foil lamination method, as appropriately selected in accordance with the electrode layer material to be used.

In the present invention, the electrode is required to have high electroconductivity, and an electrode layer formed through plating or vacuum deposition can readily realize high electroconductivity, and therefore in the present invention, a vacuum deposition method such as a vacuum evaporation method or a sputtering method, as well as an electroplating method or an electroless plating method is preferred. Depending on the dimension of the pattern to be formed and on the dimensional accuracy thereof, a pattern may be formed with ease via a hard mask such as a metal mask. In the case of film formation according to a vacuum deposition method, the substrate to be used may be heated during the process within a range not detracting from the characteristics of the substrate, for the purpose of improving the adhesiveness of the formed film to the substrate used and for the purpose of water removal. In film formation according to a plating method, an electrode layer may be formed according to an electroplating method on the layer previously formed according to an electroless plating method.

(Thermoelectric Semiconductor Material)

The thermoelectric semiconductor material to be contained in the thermoelectric element for use in the present invention includes a bismuth-tellurium-based thermoelectric semiconductor material, a telluride-based thermoelectric semiconductor material, an antimony-tellurium-based thermoelectric semiconductor material, and a bismuth-selenide-based thermoelectric semiconductor material. These thermoelectric semiconductor materials can have excellent thermoelectric performance, but when Cu is used as an electrode, the material may form an alloy phase with Cu under a high temperature condition in annealing or the like, therefore causing electrode cracking or peeling to fail in maintaining the low resistance value intrinsic to electrode materials and, as a result, the thermoelectric performance of the materials is thereby lowered. From the viewpoint of having more excellent thermoelectric performance, a bismuth-tellurium-based thermoelectric semiconductor material and a telluride-based thermoelectric semiconductor material are preferred. The bismuth-tellurium-based thermoelectric semiconductor material is preferably a p-type bismuth telluride, an n-type bismuth telluride, or $Bi_2Te_3$. The telluride-based thermoelectric semiconductor material is preferably GeTe or PbTe.

The carrier of the p-type bismuth telluride is a hole and the Seebeck coefficient thereof is positive, for which, for example, preferably used is one represented by $Bi_XTe_3Sb_{2-X}$. In this case, X preferably satisfies $0<X\leq0.8$, more preferably $0.4\leq X\leq0.6$. X being more than 0 and 0.8 or less is preferred since the Seebeck coefficient and the electrical conductivity of the material are large and the material can maintain the characteristics of a p-type thermoelectric element.

The carrier of the n-type bismuth telluride is an electron and the Seebeck coefficient thereof is negative, for which, for example, preferably used is one represented by $Bi_2Te_{3-Y}Se_Y$. In this case, Y is preferably $0\leq Y\leq3$, more preferably $0 \leq Y \leq 2.7$. Y being 0 or more and 3 or less is preferred since the Seebeck coefficient and the electrical conductivity of the material are large and the material can maintain the characteristics of an n-type thermoelectric element.

(Thermoelectric Element)

Preferably, the thermoelectric element for use in the present invention is formed of a thermoelectric semiconductor composition containing thermoelectric semiconductor fine particles, a heat-resistant resin, and any one or both of an ionic liquid and an inorganic ionic compound.

(Thermoelectric Semiconductor Fine Particles)

The thermoelectric semiconductor fine particles for use in the thermoelectric element are preferably one prepared by grinding the above-mentioned thermoelectric semiconductor material into a predetermined size, using a fine grinding mill or the like.

The blending amount of the thermoelectric semiconductor fine particles in the thermoelectric semiconductor composition is preferably 30 to 99% by mass. The amount is more preferably 50 to 96% by mass, even more preferably 70 to 95% by mass. The blending amount of the thermoelectric semiconductor fine particles falling within the above range is preferred since the Seebeck coefficient (absolute value of Peltier coefficient) is large, the electrical conductivity reduction can be prevented, only the thermal conductivity is lowered, and therefore the composition exhibits high-level thermoelectric performance and can form a film having a sufficient film strength and flexibility.

The average particle size of the thermoelectric semiconductor fine particles is preferably 10 nm to 200 μm, more preferably 10 nm to 30 μm, even more preferably 50 nm to 10 μm, and especially preferably 1 to 6 μm. Falling within the range, uniform dispersion is easy and electrical conductivity can be increased.

The method of producing the thermoelectric semiconductor fine particles by finely grinding the thermoelectric semiconductor material is not specifically defined, and the material may be ground into a predetermined size, using a known fine grinding mill or the like, such as a jet mill, a ball mill, a bead mill, a colloid mill, or a roller mill.

The average particle size of the thermoelectric semiconductor fine particles may be measured with a laser diffraction particle sizer (1064 Model, manufactured by CILAS), and the median value of the particle size distribution is taken as the average particle size.

Preferably, the thermoelectric semiconductor fine particles are annealed. (Hereinafter the annealing may be referred to as annealing treatment A.) The annealing treatment A increases the crystallinity of the thermoelectric semiconductor fine particles and further increases the Seebeck coefficient or the Peltier coefficient of the thermoelectric conversion material since the surface oxide film of the thermoelectric semiconductor fine particles could be removed, therefore further increasing the figure of merit thereof. Not specifically defined, the annealing treatment A is preferably carried out in an inert gas atmosphere such as nitrogen or argon in which the gas flow rate is controlled or in a reducing gas atmosphere such as hydrogen in which also the gas flow rate is controlled, or in a vacuum condition, and is more preferably carried out in a mixed gas atmosphere of an inert gas and a reducing gas. Specific temperature conditions depend on the thermoelectric semiconductor fine particles to be used, but in general, it is desirable that the treatment is carried out at a temperature not higher than the melting point of the fine particles but falling between 100 and 1,500° C., for a few minutes to several tens hours.

(Heat-Resistant Resin)

The heat-resistant resin for use in the present invention acts as a binder between the thermoelectric semiconductor fine particles and enhances the flexibility of the thermoelectric conversion element. The heat-resistant resin is not specifically defined. The heat-resistant resin for use herein is one that can maintain various physical properties thereof such as mechanical strength and thermal conductivity thereof as a resin without losing them in crystal growth of the thermoelectric semiconductor fine particles through annealing treatment of the thin film of the thermoelectric semiconductor composition.

The heat-resistant resin is preferably a polyamide resin, a polyamideimide resin, a polyimide resin or an epoxy resin from the viewpoint that the heat resistance thereof is higher and that the resin has no negative influence on the crystal growth of the thermoelectric semiconductor fine particles in the thin film, and is more preferably a polyamide resin, a polyamideimide resin or a polyimide resin from the viewpoint of excellent flexibility thereof. In the case where a polyimide film is used as the substrate, the heat-resistant resin is more preferably a polyimide resin from the viewpoint of adhesiveness thereof to the polyimide film. In the present invention, polyimide resin is a generic term for polyimide and its precursors.

Preferably, the decomposition temperature of the heat-resistant resin is 300° C. or higher. When the decomposition temperature falls within the above range, the resin does not lose the function thereof as a binder and can maintain the flexibility of the thermoelectric element even when the thin film of the thermoelectric semiconductor composition is annealed, as described below.

Preferably, the mass reduction in the heat-resistant resin at 300° C. in thermogravimetry (TG) is 10% or less, more preferably 5% or less, even more preferably 1% or less. When the mass reduction falls within the above range, the resin does not lose the function thereof as a binder and can maintain the flexibility of the thermoelectric element even when the thin film of the thermoelectric semiconductor composition is annealed, as described below.

The blending amount of the heat-resistant resin in the thermoelectric semiconductor composition is preferably 0.1 to 40% by mass, more preferably 0.5 to 20% by mass, even more preferably 1 to 20% by mass, still more preferably 2 to 15% by mass. The blending amount of the heat-resistant resin falling within the above range provides a film satisfying both high thermoelectric performance and film strength.

(Ionic Liquid)

The ionic liquid for use in the present invention is a molten salt of a combination of a cation and an anion, which can exist as a liquid in a broad temperature range of −50 to 500° C. The ionic liquid is characterized in that it has an extremely low vapor pressure and is nonvolatile, has excellent thermal stability and electrochemical stability, has a low viscosity and has a high ionic conductivity, and therefore, serving as a conductive assistant, the ionic liquid can effectively prevent reduction in the electrical conductivity between thermoelectric semiconductor fine particles. In addition, the ionic liquid has high polarity based on the aprotic ionic structure thereof, and is excellent in compatibility with the heat-resistance resin, and therefore can make the thermoelectric element has a uniform electrical conductivity.

The ionic liquid for use herein may be a known one or a commercially-available one. Examples thereof include those composed of a cation component of a nitrogen-containing cyclic cation compound such as pyridinium, pyrimidinium, pyrazolium, pyrrolidinium, piperidinium or imidazolium, or a derivative thereof, an amine-type cation such as tetraalkylammonium, or a derivative thereof, a phosphine-type cation such as phosphonium, trialkyl sulfonium or tetraalkyl phosphonium, or a derivative thereof, or a lithium cation or a derivative thereof, and an anion component of a chloride ion such as $Cl^-$, $AlCl_4^-$, $Al_2Cl_7^-$ or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, or $(CFSO_2)(CF_3CO)N^-$.

Among the above-mentioned ionic liquids, it is preferable that, from the viewpoint of enhancing high-temperature stability and compatibility between thermoelectric semiconductor fine particles and resin, and preventing reduction in the electrical conductivity between thermoelectric semiconductor fine particles, the cation component in the ionic liquid contains at least one selected from a pyridinium cation and a derivative, and an imidazolium cation and a derivative thereof. It is also preferable that the anion component of the ionic liquid contains a halide anion, more preferably at least one selected from $Cl^-$, $Br^-$ and $I^-$.

Specific examples of the ionic liquid in which the cation component contains a pyridinium cation or a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, and 1-butyl-4-methylpyridinium iodide. Among these, 1-butyl-4-methylpyridinium bromide, 1-butyl-4-methylpyridinium hexafluorophosphate and 1-butyl-4-methylpyridinium iodide are preferred.

Specific examples of the ionic liquid in which the cation component contains an imidazolium cation or a derivative thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-m ethylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, and 1,3-dibutylimidazolium methylsulfate. Among these, [1-butyl-3-(2-hydroxyethyl)imidazolium bromide] and [1-butyl-3-(2-hydroxyethyl)imidazolium tetrafluoroborate] are preferred.

Preferably, the ionic liquid has an electrical conductivity of $10^{-7}$ S/cm or more, more preferably $10^{-6}$ S/cm or more. When the electrical conductivity falls within the above range, the ionic liquid can effectively prevent reduction in the electrical conductivity between thermoelectric semiconductor fine particles, serving as a conductive assistant.

Also preferably, the decomposition temperature of the ionic liquid is 300° C. or higher. When the decomposition temperature falls within the above range, the ionic liquid can still maintain the effect thereof as a conductive assistant even when the thin film of the thermoelectric semiconductor composition is annealed, as described below.

Preferably, the mass reduction in the ionic liquid at 300° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the ionic liquid in the thermoelectric semiconductor composition is preferably 0.01 to 50% by mass, more preferably 0.5 to 30% by mass, even more preferably 1.0 to 20% by mass. The blending amount of the ionic liquid falling within the above range provides a film capable of effectively preventing electrical conductivity reduction and having high electroconductive performance.

(Inorganic Ionic Compound)

The inorganic ionic compound for use in the present invention is a compound composed of at least a cation and an anion. The inorganic ionic compound exists as a solid in a broad temperature range of 400 to 900° C. and is characterized by having a high ionic conductivity, and therefore, serving as a conductive assistant, the compound can prevent reduction in the electrical conductivity between thermoelectric semiconductor fine particles.

A metal cation is used as the cation.

Examples of the metal cation include an alkali metal cation, an alkaline earth metal cation, a typical metal cation and a transition metal cation, and an alkali metal cation or an alkaline earth metal cation is more preferred.

Examples of the alkali metal cation include $Li^+$, $Na^+$, $K^+$, $Rb^+$, $Cs^+$ and $Fr^+$.

Examples of the alkaline earth metal cation include $Mg^{2+}$, $Ca^{2+}$, $Sr^{2+}$ and $Ba^{2+}$.

Examples of the anion include $F^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, and $PF_6^-$.

As the inorganic ionic compound, known or commercially-available ones can be used. Examples thereof include those composed of a cation component such as a potassium cation, a sodium cation or a lithium cation, and an anion component, e.g., a chloride ion such as $Cl^-$, $AlCl_4^-$, $Al_2Cl_7^-$, or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $OH^-$, or $CN^-$.

Among the above-mentioned inorganic ionic compounds, those having at least one selected from potassium, sodium and lithium as the cation component are preferred from the viewpoint of securing high-temperature stability and compatibility between thermoelectric semiconductor fine particles and resin, and from the viewpoint of preventing reduction in the electrical conductivity between thermoelectric semiconductor fine particles. Also preferably, the anion component of the inorganic ionic compound contains a halide anion, more preferably at least one selected from $Cl^-$, $Br^-$ and $I^-$.

Specific examples of the inorganic ionic compound having a potassium cation as the cation component include KBr, KI, KCl, KF, KOH, and $K_2CO_3$. Among these, KBr and KI are preferred.

Specific examples of the inorganic ionic compound having a sodium cation as the cation component include NaBr, NaI, NaOH, NaF, and $Na_2CO_3$. Among these, NaBr and NaI are preferred.

Specific examples of the inorganic ionic compound having a lithium cation as the cation component include LiF, LiOH, and LiNO$_3$. Among these, LiF and LiOH are preferred.

Preferably, the above inorganic ionic compound has an electrical conductivity of $10^{-7}$ S/cm or more, more preferably $10^{-6}$ S/cm or more. When the electrical conductivity falls within the above range, the inorganic ionic compound serving as a conductive assistant can effectively prevent reduction in the electrical conductivity between the thermoelectric semiconductor fine particles.

Also preferably, the decomposition temperature of the inorganic ionic compound is 400° C. or higher. When the decomposition temperature falls within the above range, the inorganic ionic compound can still maintain the effect thereof as a conductive assistant even when the thin film of the thermoelectric semiconductor composition is annealed, as described below.

Preferably, the mass reduction in the inorganic ionic compound at 400° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the inorganic ionic compound in the thermoelectric semiconductor composition is preferably 0.01 to 50% by mass, more preferably 0.5 to 30% by mass, even more preferably 1.0 to 10% by mass. When the blending amount of the inorganic ionic compound falls within the above range, the electrical conductivity can be effectively prevented from lowering and, as a result, a film having an improved thermoelectric performance can be realized.

In the case where the inorganic ionic compound and the ionic liquid are used together, the total content of the inorganic ionic compound and the ionic liquid in the thermoelectric semiconductor composition is preferably 0.01 to 50% by mass, more preferably 0.5 to 30% by mass, even more preferably 1.0 to 10% by mass.

(Method for Preparing Thermoelectric Semiconductor Composition)

The method for preparing the thermoelectric semiconductor composition for use in the present invention is not specifically defined. The thermoelectric semiconductor composition may be prepared by mixing and dispersing the above-mentioned thermoelectric semiconductor fine particles, the above-mentioned ionic liquid and the above-mentioned heat-resistant resin, optionally along with any other additives and also with a solvent added thereto, according to a known method using an ultrasonic homogenizer, a spiral mixer, a planetary mixer, a disperser, or a hybrid mixer.

Examples of the solvent include toluene, ethyl acetate, methyl ethyl ketone, alcohols, tetrahydrofuran, methylpyrrolidone, and ethyl cellosolve. One alone or two or more different types of these solvents may be used here either singly or as combined. The solid concentration of the thermoelectric semiconductor composition is not specifically defined so far as the composition may have a viscosity suitable for coating operation.

A thin film of the thermoelectric semiconductor composition may be formed by applying the thermoelectric semiconductor composition onto a substrate and drying it thereon. According to the formation method, a large-area thermoelectric element can be produced in a simplified manner at a low cost.

The thickness of the thin film of the thermoelectric semiconductor composition is not specifically defined, but is, from the viewpoint of the thermoelectric performance and the film strength, preferably 100 nm to 200 μm, more preferably 300 nm to 150 μm, even more preferably 5 to 150 μm.

The thermoelectric element for use in the present invention may be used singly, but for example, plural pieces of the thermoelectric element may be used by being electrically connected in series to each other via an electrode and thermally connected in parallel to each other via a thermally insulating flexible sheet, and can be used as a thermoelectric conversion device for power generation or for cooling.

(Thermoelectric Conversion Module)

The thermoelectric conversion module is preferably so configured that the electrode formed of the electrode material for thermoelectric conversion modules is kept in contact with the thermoelectric element.

In the thermoelectric conversion module of the present invention, the metal material of the present invention is used as the electrode material for the electrode. Also as mentioned above, the thermoelectric element contains a specific material of a bismuth-tellurium-based thermoelectric semiconductor material or the like. Further, as the thermoelectric element, a thin film of a thermoelectric semiconductor material containing thermoelectric semiconductor fine particles, a heat-resistant resin, and one or both of an ionic liquid and an inorganic ionic compound is used as having excellent thermoelectric performance.

The configuration of the thermoelectric element in the thermoelectric conversion module is not specifically limited, but for example, as mentioned above, the element may be any of a t-type or an in-plane-type one that may be appropriately used depending on the use for power generation or cooling.

(Method for Producing Thermoelectric Conversion Module)

The thermoelectric conversion module including an electrode formed of the electrode material of the present invention can be produced according to a method including a step of forming the above-mentioned electrode on a substrate (hereinafter this may be referred to as an electrode forming step), a step of applying the above-mentioned thermoelectric semiconductor composition thereto and drying it to form a thin film (hereinafter this may be referred to as a thin film forming step), further a step of annealing the thin film (hereinafter this may be referred to as an annealing step), and further a step of adhering the annealed substrate to another substrate (hereinafter this may be referred to as an adhering step).

The steps included in the present invention are described sequentially below.

(Electrode Forming Step)

The electrode forming step is a step of forming a pattern of the above-mentioned metal material on a first substrate, and the method of forming on a substrate and the patterning method are as described hereinabove.

(Thin Film Forming Step)

The thin film forming step is a step of applying a thermoelectric semiconductor composition to, for example, the first substrate having the first electrode formed as in the above. The method of applying the thermoelectric semiconductor composition to a substrate is not specifically defined, for which employable is any known method of screen printing, flexographic printing, gravure printing, spin coating, dip coating, die coating, spray coating, bar coating, or doctor blade coating. In the case where the coating film is pattern-like formed, preferably employed is screen printing or slot die coating that realizes patterning in a simplified manner using a screen having a desired pattern.

Next, the resultant coating film is dried to give a thin film. As the drying method, employable is any known drying method such as hot air drying, hot roll drying, or IR radiation. The heating temperature is generally from 80 to 150° C., and the heating time is generally from a few seconds to several tens minutes though it varies depending on the heating method.

In the case where a solvent is used in preparing the thermoelectric semiconductor composition, the heating temperature is not specifically defined so far as it falls within a temperature range capable of removing the used solvent through vaporization.

(Annealing Step)

The annealing step is, for example, a step of annealing the first substrate having the first electrode and the thermoelectric element formed thereon as in the above.

The formed thermoelectric element is, after thin film formation, preferably further annealed (hereinafter this treatment may be referred to as annealing treatment B). The annealing treatment B stabilizes the thermoelectric performance of the material and promotes the crystal growth of the thermoelectric semiconductor fine particles in the thin film, therefore further enhancing the thermoelectric performance of the material. Not specifically defined, the annealing treatment B is preferably carried out in an inert gas atmosphere such as nitrogen or argon or in a reducing gas atmosphere, in which the gas flow rate is controlled, or in a vacuum condition. Depending on the upper temperature limit of the resin and the ionic compound to be used, the treatment may be carried out at 100 to 500° C. for a few minutes to several tens hours.

(Adhering Step)

The adhering step is, for example, a step of adhering the first substrate having the first electrode and the thermoelectric element formed thereon after the annealing step as described above, to a second substrate having a second electrode to construct a thermoelectric conversion module.

The adhering agent to be used for the adhering includes, though not specifically limited thereto, an electroconductive paste. The electroconductive paste includes a copper paste, a silver paste and a nickel paste, and in the case where a binder is used, it includes an epoxy resin, an acrylic resin and a urethane resin.

The method of applying the adhering agent to a substrate may be any known method such as a screen printing method or a dispensing method.

According to the production method for the thermoelectric conversion module including an electrode formed of the electrode material of the present invention, a thermoelectric conversion module can be produced in a simplified method, which can prevent cracking and peeling of electrodes that may occur at the bonding parts of the thermoelectric element and the electrode therein to thereby maintain a low resistance at the bonding parts, which has high thermoelectric performance and which uses a low-cost thermoelectric element.

EXAMPLES

Next, the present invention is described in more detail by reference to Examples, but it should be construed that the present invention is not limited to these Examples at all.

The resistance value of the test pieces of the thermoelectric conversion materials produced in Examples and Comparative Examples was evaluated according to the method mentioned below.

<Evaluation of Resistance Value>

Figure 3:
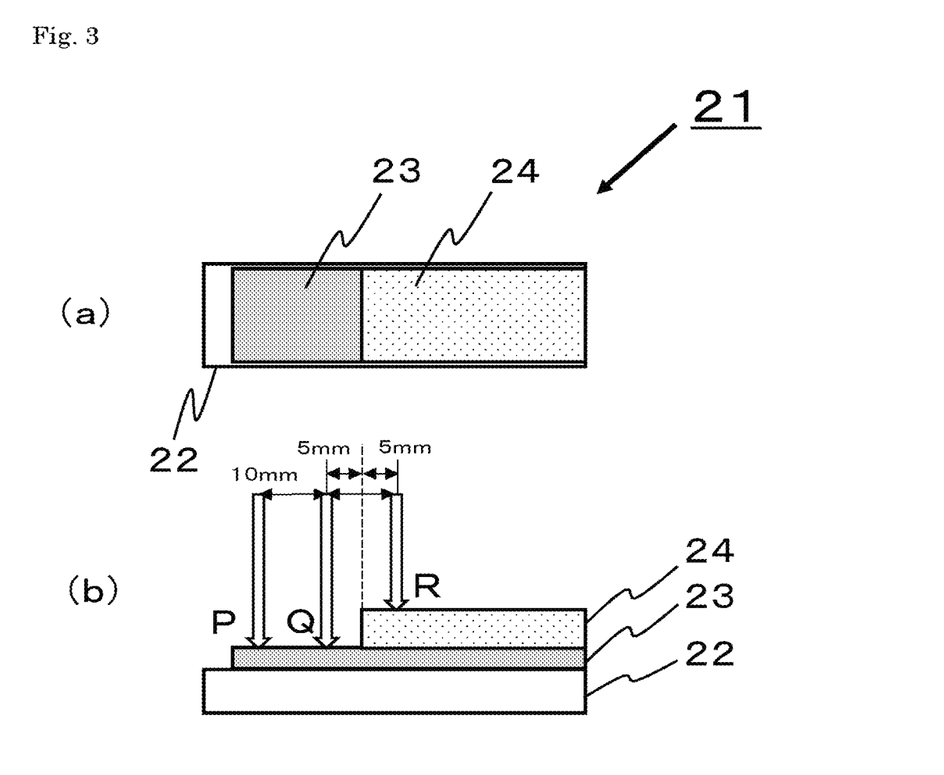
FIG. 3 is a view for explaining locations for measurement of each electric resistance value of the electrode and between the thermoelectric element-electrode of a thermoelectric conversion material (test piece) produced in Examples and Comparative Examples.

The electric resistance value of the electrode and between the thermoelectric element-electrode of a thermoelectric conversion material (test piece) produced in Examples and Comparative Examples was measured at the measurement location shown in FIG. 3, using a resistance measuring device (Model, Digital Multimeter 34401A, manufactured by Agilent Corporation) in an environment at 25° C. and 60% RH.

FIG. 3 is a view for explaining locations for measurement of each electric resistance value of the electrode and between the thermoelectric element-electrode of a thermoelectric conversion material (test piece) produced in Examples and Comparative Examples, in which (a) is a plan view of a thermoelectric conversion material (test piece), and (b) is a cross-sectional view of a thermoelectric conversion material (test piece). In the present invention, each electric resistance value of an electrode 23 of a resultant thermoelectric conversion material (test piece) 21 (between P-Q (parallel to the long side direction of the polyimide substrate)), and between the thermoelectric element 24-electrode 23 (between R-Q (parallel to the long side direction of the polyimide substrate)) on the polyimide substrate 22 was measured.

(Production of Thermoelectric Semiconductor Fine Particles)

Using a planetary ball mill (Premium Line P-7, manufactured by Fritsch Japan Co., Ltd.), a p-type bismuth telluride $Bi_{0.4}Te_3Sb_{1.6}$ (manufactured by Kojundo Chemical Laboratory Co., Ltd., particle size: 180 µm) of a bismuth-tellurium-based thermoelectric semiconductor material was ground in a nitrogen gas atmosphere to give thermoelectric semiconductor fine particles having an average particle size of 1.2 µm. The resultant ground thermoelectric semiconductor fine particles were analyzed for particle size distribution, using a laser diffraction particle size analyzer (Model 1064, manufactured by CILAS Corporation).

Example 1

(1) Production of Thermoelectric Semiconductor Composition 92 parts by mass of the p-type bismuth telluride $Bi_{0.4}Te_{2.0}Sb_{1.6}$ fine particles obtained in the above, 3 parts by mass of a polyamic acid being a polyimide precursor as a heat-resistant resin (poly(pyromellitic dianhydride-co-4, 4'-oxydianiline)amide acid solution manufactured by Sigma-Aldrich Corporation, solvent: N-methylpyrrolidone, solid concentration: 15% by mass), and 5 parts by mass of an ionic liquid, N-butyl pyridinium were mixed and dispersed to give a coating liquid of a thermoelectric semiconductor composition.

(2) Formation of Electrode Pattern

On a polyimide substrate (product name: Kapton 200H, manufactured by Toray-DuPont Co., Ltd., 25 mm×45 mm, thickness 50 µm), a nickel material (manufacture by Kojundo Chemical Laboratory Co., Ltd.) was deposited to have a thickness of 100 nm according to a vacuum evaporation method via a metal mask (manufactured by Mitani Micronics Co., Ltd., 25 mm×45 mm, thickness: 0.7 mm, opening: 20 mm×40 mm), thereby forming an electrode pattern thereon.

(3) Formation of Thermoelectric Element

The coating liquid prepared in the above (1) was applied onto the electrode pattern formed in (2) according to a spin coating method, and dried in an argon atmosphere at a temperature of 150° C. for 10 minutes to form a thin film thereon having a thickness of 40 μm. Next, the resultant thin film was heated at a heating rate of 5 K/min in an atmosphere of a mixed gas of hydrogen and argon (hydrogen/argon=3 vol %/97 vol %), and kept therein at 300° C. for 1 hour for annealing after thin film formation to attain crystal growth of the fine particles of the thermoelectric semiconductor material to thereby form a thermoelectric element. The electric resistance value of the electrode and between the thermoelectric element-electrode of the resultant thermoelectric conversion material (test piece) was measured. The results are shown in Table 1.

Example 2

A thermoelectric element was formed in the same manner as in Example 1, except that the metal material for the electrode was gold (thickness: 100 nm).

Example 3

A thermoelectric element was formed in the same manner as in Example 1, except that the metal material for the electrode was aluminum (thickness: 100 nm).

Example 4

A thermoelectric element was formed in the same manner as in Example 1, except that gold (thickness: 100 nm) was layered on the electrode of a nickel material in Example 1 according to a vacuum evaporation method to make the electrode have a 2-layered configuration.

Example 5

A thermoelectric element was formed in the same manner as in Example 1, except that, as the metal material for the electrode, a nickel (9 am) layer was formed by electroless plating on the copper film of a copper foil-attached polyimide substrate (manufactured by Ube Exsymo Co., Ltd., product name: Upisel N, polyimide substrate thickness: 50 μm, copper foil: 9 μm), and then a rhodium layer (thickness: 300 nm) was formed by electroplating on the nickel layer.

Example 6

A thermoelectric element was formed in the same manner as in Example 1, except that, as the metal material for the electrode, a platinum layer (300 nm) was formed by electroplating on the copper film of a copper foil-attached polyimide substrate (manufactured by Ube Exsymo Co., Ltd., product name: Upisel N, polyimide substrate thickness: 50 μm, copper foil: 9 μm).

Example 7

A thermoelectric element was formed in the same manner as in Example 1, except that, as the metal material for the electrode, a nickel (9 μm) layer was formed by electroless plating on the copper film of a copper foil-attached polyimide substrate (manufactured by Ube Exsymo Co., Ltd., product name: Upisel N, polyimide substrate thickness: 50 μm, copper foil: 9 μm), and then a chromium layer (thickness: 300 nm) was formed by electroplating on the nickel layer.

Example 8

A thermoelectric element was formed in the same manner as in Example 1, except that, as the metal material for the electrode, a nickel (9 μm) layer was formed by electroless plating on the copper film of a copper foil-attached polyimide substrate (manufactured by Ube Exsymo Co., Ltd., product name: Upisel N, polyimide substrate thickness: 50 μm, copper foil: 9 μm), and then a palladium layer (thickness: 500 nm) and a gold layer (100 nm) were formed by electroless plating on the nickel layer.

Example 9

A thermoelectric element was formed in the same manner as in Example 1, except that, as the metal material for the electrode, a stainless steel foil-attached polyimide substrate (manufactured by Ube Exsymo Co., Ltd., product name: Upisel C, polyimide substrate thickness: 25 μm, SUS403 foil: 20 μm) was used.

Example 10

A thermoelectric element was formed in the same manner as in Example 1, except that, as the metal material for the electrode, a gold layer (100 nm) was formed by electroplating on the stainless steel film of a stainless steel foil-attached polyimide substrate (manufactured by Ube Exsymo Co., Ltd., product name: Upisel C, polyimide substrate thickness: 25 μm, SUS403 foil: 20 μm).

Comparative Example 1

A thermoelectric element was formed in the same manner as in Example 1, except that the metal material for the electrode was copper (100 nm).

TABLE 1

| | Electrode | | Electric Resistance Value (Ω) | | |
|---|---|---|---|---|---|
| | Layer of Metal Material | Thickness (μm) | Electrode | Thermoelectric Element-Electrode | Appearance |
| Example 1 | nickel | 0.1 | 1 | 5 | no change |
| Example 2 | gold | 0.1 | 0.2 | 2 | no change |
| Example 3 | aluminum | 0.1 | 1 | 5 | no change |
| Example 4 | gold/nickel | 0.1/0.1 | 0.1 | 1 | no change |
| Example 5 | rhodium/nickel | 0.3/9 | 0.1 | 1 | no change |
| Example 6 | platinum | 0.3 | 0.2 | 1.1 | no change |
| Example 7 | chromium/nickel | 0.3/9 | 0.5 | 2 | no change |
| Example 8 | gold/palladium/nickel | 0.1/0.5/9 | 0.2 | 1.5 | no change |

TABLE 1-continued

| | Electrode | | Electric Resistance Value (Ω) | | |
|---|---|---|---|---|---|
| | Layer of Metal Material | Thickness (μm) | Electrode | Thermoelectric Element-Electrode | Appearance |
| Example 9 | SUS403 | 20 | 1 | 3 | no change |
| Example 10 | gold/SUS403 | 0.1/20 | 0.2 | 1 | no change |
| Comparative Example 1 | copper | 0.1 | 50 | 70 | Cracking and peeling occurred. |

Using the electrode materials of Examples 1 to 10, the resistance value was low, and neither cracking nor peeling occurred, differing from Comparative Example 1 using copper.

INDUSTRIAL APPLICABILITY

When applied to a bismuth telluride-based thermoelectric semiconductor material and the like having high thermoelectric performance, the electrode material for thermoelectric conversion modules of the present invention enables high-temperature heat treatment and further improves the thermoelectric performance intrinsic to the thermoelectric semiconductor material and, as a result, a thermoelectric conversion module having high thermoelectric performance can be produced. In addition, the yield in the production process can be improved.

The thermoelectric conversion module using the electrode material for thermoelectric conversion modules of the present invention includes a thermoelectric conversion material that can be produced in a simplified manner at a low cost and has excellent thermoelectric performance, and is considered to be applicable to use for converting exhaust heat from various combustion furnaces in factories, waste combustion furnaces or cement combustion furnaces, or automobile combustion gas exhaust heat or electronics exhaust heat into electricity for power generation use. Regarding cooling use, for example, the module can be used for temperature control for various sensors of semiconductor devices, CCD (charge coupled devices), MEMS (micro electro mechanical systems), optical receivers and others, in the field of electronics instruments.

REFERENCE SIGNS LIST

1: Thermoelectric Conversion Module
2a: First Substrate
2b: Second Substrate
3a: First Electrode
3b: Second Electrode
4a: p-type Thermoelectric Element
4b: n-type Thermoelectric Element
5: Bonding Part
11: Thermoelectric Conversion Module
12a: First Substrate
12b Second Substrate
13: Electrode
14a: p-type Thermoelectric Element
14b: n-type Thermoelectric Element
15: Bonding Part
21: Thermoelectric Conversion Material (test piece)
22: Polyimide Substrate
23: Electrode
24: Thermoelectric Element

The invention claimed is:

1. A thermoelectric conversion module, comprising:
a first substrate and a second substrate facing each other,
a thermoelectric element formed between the first substrate and the second substrate, and
an electrode formed on at least one of the first substrate and the second substrate,
wherein the first substrate and the second substrate are plastic films,
the thermoelectric element comprises a bismuth-tellurium-based thermoelectric semiconductor material, a telluride based thermoelectric semiconductor material, an antimony-tellurium-based thermoelectric semiconductor material, or a bismuth-selenide-based thermoelectric semiconductor material,
the electrode that is directly in contact with the thermoelectric element is formed of a metal material, and
a layer of the metal material is a laminate comprising
any of the combination of rhodium layer and nickel layer, gold layer and stainless steel layer, and platinum layer and nickel layer,
or
two or more of a rhodium layer, platinum layer, and stainless steel layer.

2. The thermoelectric conversion module according to claim 1, wherein a thickness of the layer of the metal material is from 10 nm to 200 μm.

3. The thermoelectric conversion module according to claim 1, wherein the thermoelectric element comprises a bismuth-tellurium based thermoelectric semiconductor material and the bismuth-tellurium-based thermoelectric semiconductor material is a p-type bismuth telluride, an n-type bismuth telluride, or $Bi_2Te_3$.

4. The thermoelectric conversion module according to claim 1,
wherein the plastic film is at least one selected from the group consisting of a polymide film, a polyamide film, a polyether imide film, a polyaramid film and a polyamideimide film.

5. The thermoelectric conversion module according to claim 1,
wherein the thermoelectric element is formed of a thin film of a thermoelectric semiconductor composition comprising thermoelectric semiconductor fine particles, a heat-resistant resin and an ionic liquid.

* * * * *